(12) United States Patent
Hidaka et al.

(10) Patent No.: US 6,696,223 B2
(45) Date of Patent: Feb. 24, 2004

(54) METHOD FOR PERFORMING PHOTOLITHOGRAPHY

(75) Inventors: Tetsuya Hidaka, Nagano (JP); Yawara Kaneko, Chigasaki (JP)

(73) Assignee: Agilent Technologies, Inc., Palo Alto, CA (US)

( * ) Notice: Subject to any disclaimer, the term of this patent is extended or adjusted under 35 U.S.C. 154(b) by 20 days.

(21) Appl. No.: 09/933,479

(22) Filed: Aug. 16, 2001

(65) Prior Publication Data

US 2002/0001779 A1 Jan. 3, 2002

Related U.S. Application Data

(63) Continuation of application No. PCT/US00/03265, filed on Feb. 8, 2000.

(51) Int. Cl.[7] ................................................. G03F 7/00
(52) U.S. Cl. ........................ 430/313; 430/311; 430/315; 430/322; 430/324; 430/395; 430/396
(58) Field of Search ................................. 430/311, 313, 430/315, 322, 324, 396, 395

(56) References Cited

U.S. PATENT DOCUMENTS

| | | | |
|---|---|---|---|
| 4,189,230 A | * 2/1980 | Zasio | 355/76 |
| 5,200,300 A | 4/1993 | Leibovitz et al. | 430/312 |
| 5,420,048 A | 5/1995 | Kondo | 437/21 |
| 5,637,519 A | 6/1997 | Tsai et al. | 438/160 |
| 5,679,498 A | 10/1997 | Greenwood et al. | 430/312 |
| 5,686,230 A | * 11/1997 | Nellissen | 430/395 |
| 5,976,902 A | 11/1999 | Shih | 438/30 |
| 5,981,150 A | * 11/1999 | Aoki et al. | 430/322 |
| 6,194,272 B1 | * 2/2001 | Sung | 438/266 |
| 6,380,564 B1 | * 4/2002 | Chen et al. | 257/99 |
| 2002/0001779 A1 | * 1/2002 | Hidaka et al. | 430/313 |

FOREIGN PATENT DOCUMENTS

| | | | | |
|---|---|---|---|---|
| DE | 2534158 A1 | 7/1975 | ............ | H01L/21/31 |
| DE | 19651590 A1 | 12/1996 | ............ | H01L/21/33 |
| EP | 0342061 A2 | 5/1989 | ............ | G03B/41/00 |
| EP | 0740376 A1 | 10/1996 | ............ | H01S/3/19 |
| EP | 0921577 A1 | 6/1999 | ............ | H01L/33/00 |
| JP | 61-108150 | * 5/1986 | | |
| JP | 10-321912 | 12/1998 | ............ | H01L/33/00 |
| JP | 2000-243688 | * 9/2000 | | |
| WO | WO 98/49708 | 11/1998 | ............ | H01J/29/10 |
| WO | WO 00/49464 | * 8/2000 | | |

OTHER PUBLICATIONS

Junichi Nishizawa, Yasuo Tarui et al. "Contact Printing" Ultra–LAI Encyclopedia, Science Forum, Japan 1998, p. 802.

Junichi Nishizawa, Yasuo Tarui et al. "Reduction–Type Projection Printing" Ultra–LAI Encyclopedia, Science Forum, Japan 1998, p. 394.

Junichi Nishizawa , Yasuyo Tarui et al. "Electron Beam Lithography" Ultra–LAI Encyclopedia, Science Forum, Japan 1998, p. 568.

Junichi Nishizawa, Yasuo Tarui et al. "Electron Beam Exposure System" Ultra–LAI Encyclopedia, Science Forum, Japan 1998, p. 568.

* cited by examiner

Primary Examiner—Mark F. Huff
Assistant Examiner—Nicole Barreca

(57) ABSTRACT

A method for generating a photoresist pattern on top of an object that includes a layer of material that is opaque to light of a predetermined wavelength. The object is first covered with a layer of photoresist material. The layer of photoresist material is then irradiated with light of the predetermined wavelength from a position under the object such that the object casts a shadow into the layer of photoresist. The photoresist material is then developed to generate the photoresist pattern. The layer of photoresist material is irradiated from below the object by providing a reflecting surface below the object and a light source above the object. A mask is positioned between the object and the light source such that the mask casts a shadow that covers the object and a portion of the area surrounding the object. The method of the invention is well suited for depositing a layer of dielectric material over a device in which the dielectric layer has a via therethrough terminating on a metallic pad that is part of the device.

5 Claims, 3 Drawing Sheets

METHOD FOR PERFORMING PHOTOLITHOGRAPHY

This is a continuation of International Application PCT/US00/03265, filed Feb. 8, 2000, which was published in English as WO 00/49464 under PCT Article 21(2).

FIELD OF THE INVENTION

The invention relates to the fabrication of semiconductor devices, and more particularly, to a photolithography method for manufacturing a device by using part of the formed device as a mask and exposing a photoresist with light that passes through the other portion of the device.

BACKGROUND OF THE INVENTION

The invention can be more easily understood with reference to the fabrication of insulating layers; however, it will be obvious to those skilled in the art from the following discussion that the invention may be utilized in a wide variety of processes. Semiconductor fabrication often requires the formation of an insulating layer structure aligned with the surface of semiconductor devices having microstructures on the order of $\mu$m. For example, Yoshinori Kimura, et al. have disclosed a method for forming a semiconductor laser device using a GaN-based material (*Jpn. J. Appl. Phys.*, Vol. 37 (1998), pp. L1231–L1233) in which a narrow optical waveguide with a width of 5 $\mu$m or less must be fabricated. A photoresist that has been patterned to a width of about 5 $\mu$m, or an etching mask material that has been patterned using this photoresist, is used as an etching mask. The underlying GaN-based material having the base pattern is etched to form a multi-mesa structure. With a device such as this, the area around the optical waveguide must be covered with an insulating material to insulate the portion around the optical waveguide from the electrode pad provided on top of this insulating material.

A number of prior art methods have been used to form such a structure. For example, a photoresist pattern can be photolithographically formed over the optical waveguide, the pattern being adjusted such that it is smaller than the optical waveguide. $SiO_2$ or the like is then vapor-deposited over the entire surface, and then an organic solvent, a photoresist exfoliant, or the like is used to remove the $SiO_2$ on the photoresist along with the photoresist in the regions of the underlying pattern that must exposed to make electrical contacts.

Alternatively, when the base pattern is formed, a second layer composed of another material is simultaneous patterned. These layers are then used as etching mask materials and the underlying GaN-based material is etched. An insulating film such as $SiO_2$ is then vapor-deposited, and the second layer and overlying insulating film are removed together to form an insulating film pattern. For example, in GaN systems, the GaN-based material is etched by reactive ion etching with the photoresist used during the formation of the base pattern still intact. Then lift-off patterning of the $SiO_2$ or other insulating film is performed using this photoresist as a lift-off material.

In the above-described methods, the photomask and the pattern formed first on the sample have to be properly aligned by a process that substantially increases the cost of fabrication. The alignment is typically checked manually using alignment marks on the sample and alignment marks on the photomask. An XY and rotary stage is then used to align the relative positions of the photomask and the sample until any misalignment is within tolerance. However, because an alignment margin of about 1 $\mu$m is required, these methods can only be applied to a photomask that is about 1 to 2 $\mu$m smaller than the base pattern.

The alignment may also be performed using an electron beam lithography system or a photo-stepper having a high-precision, automatic positioning system. However, the high cost of this equipment significantly increases the manufacturing cost.

To avoid the alignment costs, a $SiO_2$ or other insulating film is vapor-deposited over the entire surface of a sample, and the insulating film is removed from just the desired area by photolithography and etching technology. For example, in the etching of the GaN-based material, the photoresist serving as the mask material on top thereof is also etched. Unfortunately, the resultant pattern is rounded off, particularly at the edges. In addition, the reaction products produced during the etching make it more difficult for the photoresist to be peeled away. The shape changes in the photoresist and the formation of reaction products lead to diminished yields, which, in turn, increase the cost of manufacture. While this method does not require an accurate mask-alignment step, it does require the selective removal of the $SiO_2$ or other insulating film formed on the sample surface along with the photoresist after the etching of the GaN-based material.

Broadly, it is the object of the invention to provide an improved fabrication method for providing a patterned insulating layer over an underlying semiconductor device or the like.

It is a further object of the invention to provide a fabrication method that does not require a high-precision alignment operation.

It is a still further object of the invention to provide a fabrication method that does not require costly alignment equipment.

These and other objects of the invention will become apparent to those skilled in the art from the following detailed description of the invention and the accompanying drawings.

SUMMARY OF THE INVENTION

The invention is a method for generating a photoresist pattern on top of an object that includes a layer of material that is opaque to light of a predetermined wavelength. The object is first covered with a layer of photoresist material. The layer of photoresist material is then irradiated with light of the predetermined wavelength from a position under the object such that the object casts a shadow into the layer of photoresist. The photoresist material is then developed to generate the photoresist pattern. The layer of photoresist material is irradiated from below the object by providing a reflecting surface below the object and a light source above the object. A mask is positioned between the object and the light source such that the mask casts a shadow that covers the object and a portion of the area surrounding the object.

The method of the invention is well suited for depositing a layer of dielectric material over a device in which the dielectric layer has a via therethrough terminating on a metallic pad that is part of the device.

DETAILED DESCRIPTION OF THE INVENTION

Figure 1:
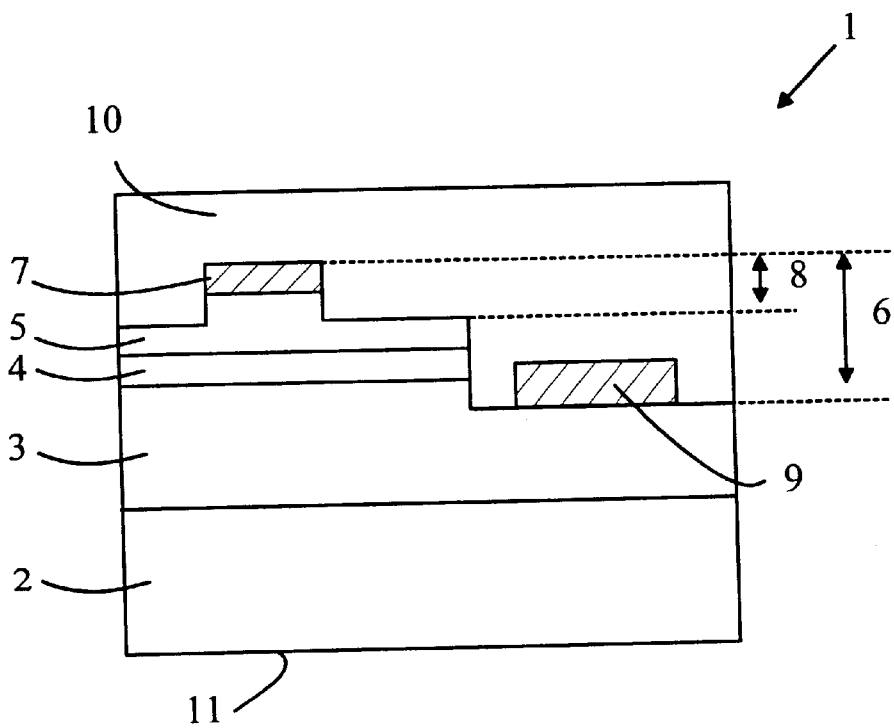
FIG. 1 is a cross-sectional view of a partially fabricated laser diode in which the various layers that make up the final laser have been deposited and etched back to form a mesa structure.

The manner in which the invention achieves its advantages may be more easily understood with reference to an exemplary application of the method of the invention to the fabrication of an edge emitting laser diode. Refer now to FIG. 1, which is a cross-sectional view of a partially fabricated laser diode 1 in which the various layers that make up the final laser have been deposited and etched back to form a mesa structure. As shown in FIG. 1, the device includes an n-GaN layer 3, a multi-quantum well (MQW) layer 4, and a p-GaN layer 5 grown in that order on a sapphire substrate 2 by conventional vapor deposition process such as MOCVD. The layered stack was then converted to a mesa structure 6 by etching these layers to a depth part-way through the n-GaN layer 3, thereby forming a mesa structure 6. The mesa structure 6 typically has a width of 100 $\mu$m and a height of approximately 1.4 $\mu$m.

Next, the metallic electrodes through which power will be provided to the finished device are deposited. A nickel thin film 7 with a thickness of 50 nm is deposited on the p-GaN layer by vacuum vapor deposition. The nickel thin film 7 is then patterned by photolithography and etching to form a pattern with a width of 1 to 100 $\mu$m. This patterned nickel thin film 7 is used as an etching mask to etch the p-GaN by reactive ion etching and to provide a protrusion 8 with a height of 400 nm on the top of the mesa structure 6. Then, a thin film 9 of aluminum in a thickness of 200 nm is formed by a lift-off method on the exposed portion of n-GaN next to the bottom of the mesa structure 6.

Figure 2:
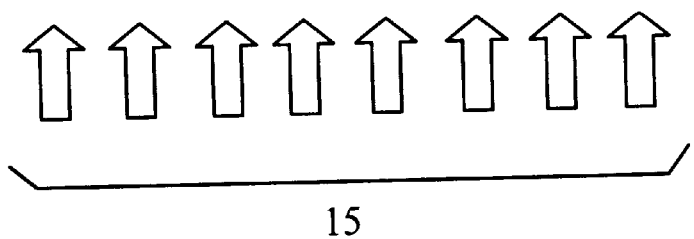
FIG. 2 is a cross-sectional view of the laser diode shown in FIG. 1 after the photoresist layer of the invention has been patterned.
Figure 2:
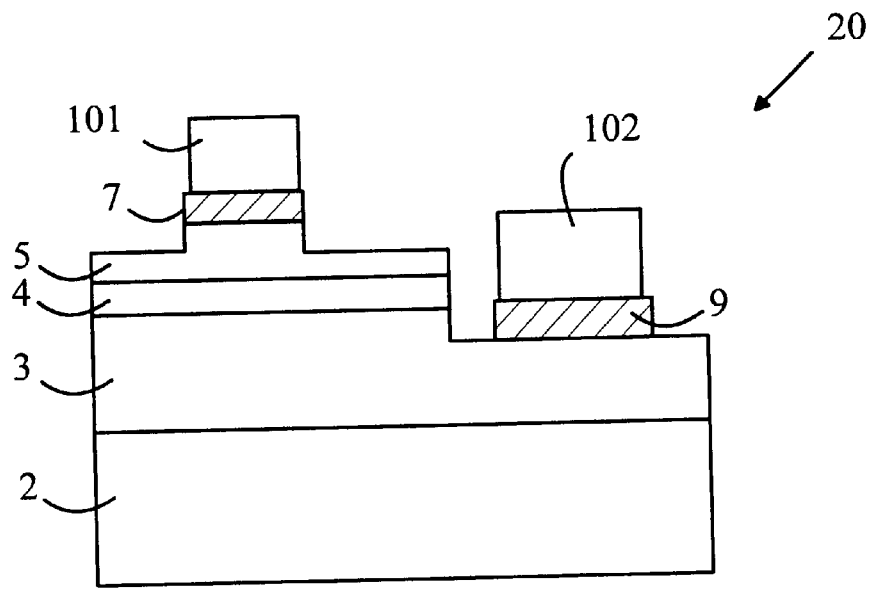

In addition to providing the power connection points to the completed device, thin film 7 and thin film 9 form the base pattern used by the present invention in the deposition of a dielectric layer that covers the edges of the mesas. This dielectric layer prevents short circuits to the electrodes during the deposition of the metal layer used to connect the device to other circuitry. In this step, the entire top surface of the above-mentioned structure is coated by spin coating with a photoresist such as AZ6124 made by Hoechst, to form a photoresist layer 10 with a thickness of 2.5 $\mu$m. The photoresist layer is then patterned utilizing a light source 15 that exposes photoresist layer 10 from the underside 11 of substrate 2 such that the thin films 7 and 9 act as exposure masks. An ultraviolet exposure of 20 seconds at an energy density of 1.5 mW per square centimeter is sufficient to expose the photoresist layer discussed above provided the wavelength is chosen such that the substrate is transparent at that wavelength. After irradiation, the device is immersed for 40 seconds in a developer (such as an AZ developer made by Hoechst that has been diluted 1:1 with ionic water) to remove that portion of the resist which had been irradiated with the ultraviolet light. A cross-sectional view of the resulting structure 20 having photoresist patterns 101 and 102 is shown in FIG. 2.

Figure 3:
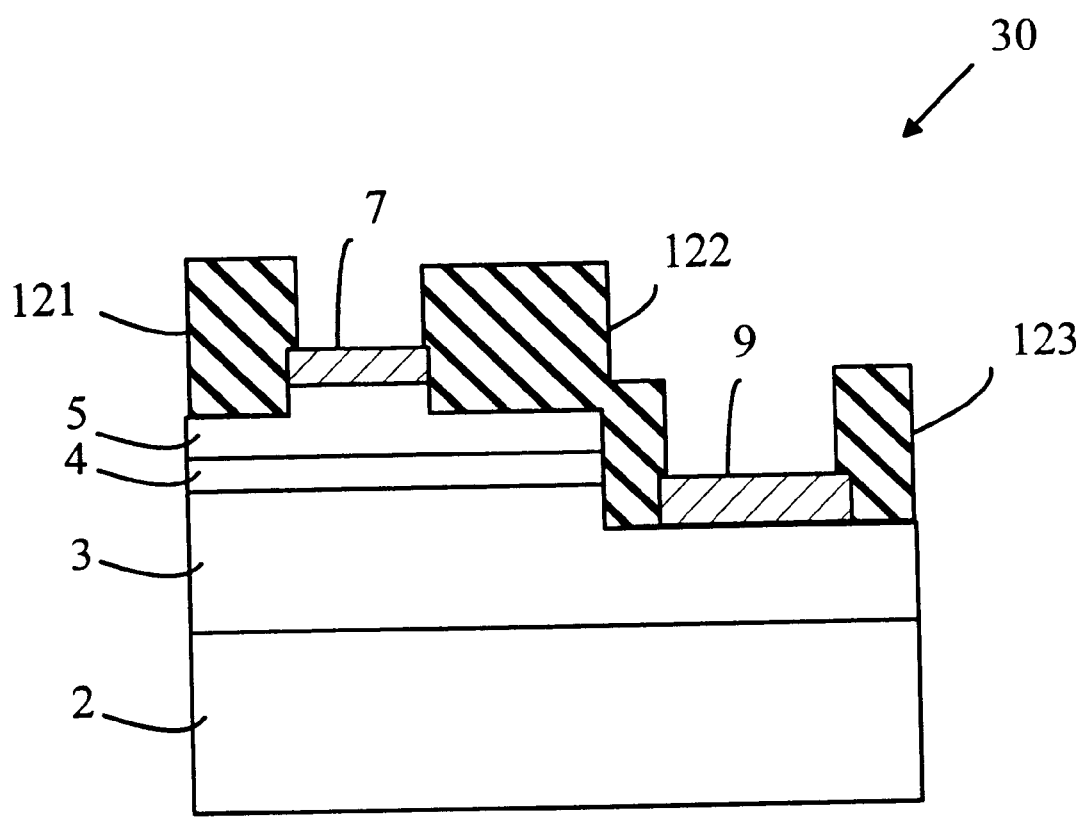
FIG. 3 is a cross-sectional view of the laser diode shown in FIGS. 1 and 2 after the deposition of the dielectric layer.

Refer now to FIG. 3, which is a cross-sectional view of the device after the deposition of the dielectric layer. A SiO2 film is then vapor-deposited on top of structure 20. The SiO2 over the photoresist patterns 101 and 102 is then removed by a conventional lift-off method to form SiO2 films 121, 122, and 123, while leaving thin films 7 and 9 free for subsequent metal deposition which yields the device structure 30 shown in FIG. 3.

The shape of the photoresist pattern generated in the above-described procedure has been measured with a scanning electron microscope. The results indicated that the photoresist pattern had more or less the same shape as that of the underlying metal films. The difference in size between the formed photoresist and the underlying nickel thin film was about 0.2 to 0.3 $\mu$m when the method discussed above was utilized. Hence, the method of the invention can be used to form a photoresist pattern even on a base pattern with a width of 0.5 to 1 $\mu$m.

The above-described embodiment of the invention utilized aluminum and nickel as the base pattern. However, it will be obvious to those skilled in the art from the preceding discussion that any material that blocks light can be utilized. For example, tungsten, titanium, platinum, palladium, tantalum, chromium, silver, gold, aluminum, or another light-blocking material could be utilized in place of nickel or aluminum.

The embodiment of the invention described above utilized an arrangement in which the light source used to expose the photoresist was placed under the substrate on which the laser was being fabricated. However, arrangements in which the light source is placed above the substrate may also be utilized. Such arrangements allow the substrate to be mounted to an opaque carriage such as those used in a conventional photolithographic apparatus.

Figure 4:
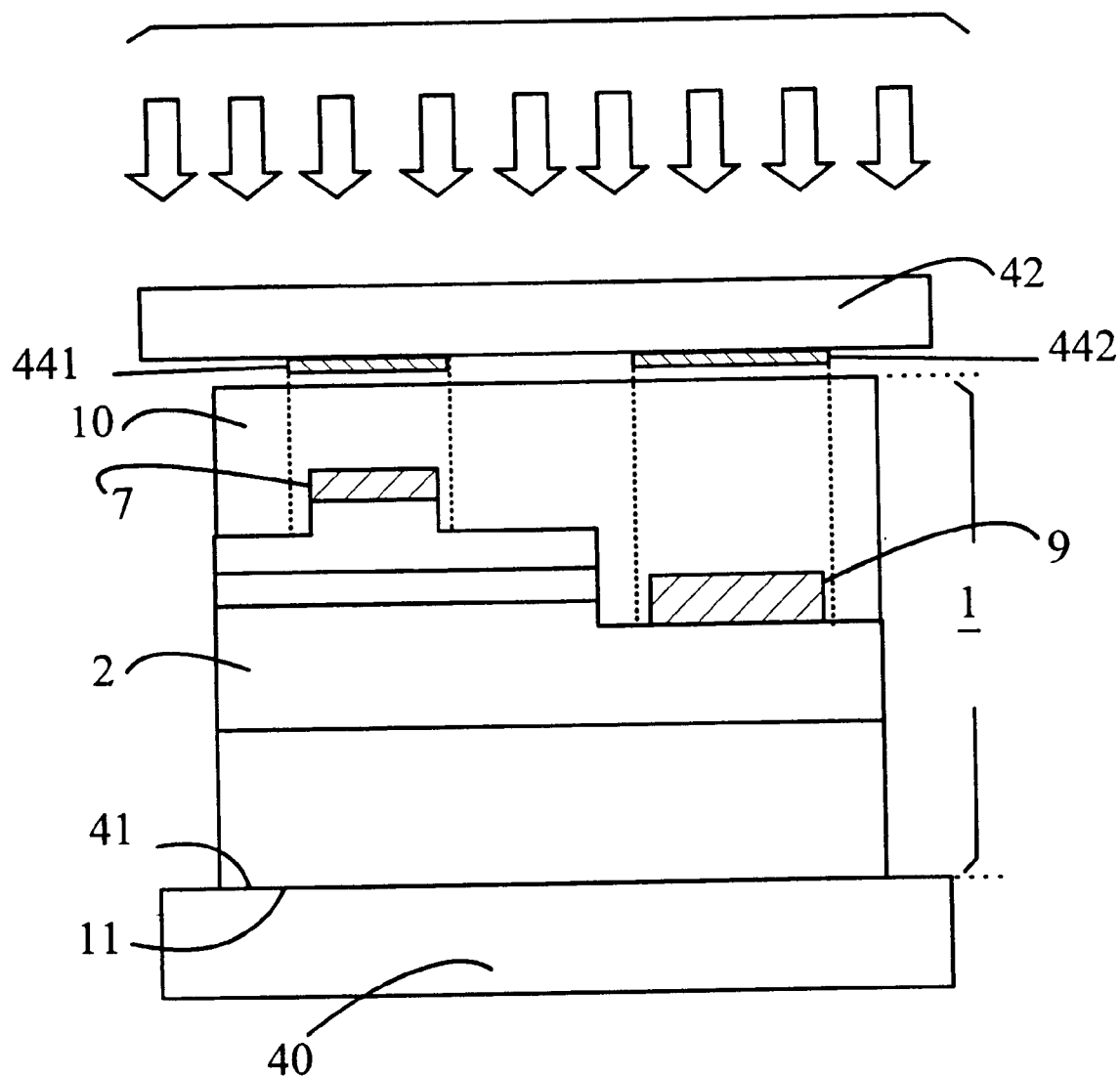
FIG. 4 is a cross-sectional view of a partially fabricated laser diode illustrating the manner in which a light source above the substrate can be utilized in the invention.

Refer now to FIG. 4, which illustrates the manner in which the invention can be practiced with a light source above the substrate. FIG. 4 is a cross-sectional view of the substrate and layers at the same stage of the fabrication process as shown in FIG. 1. The device structure shown in FIG. 1 is placed on a table 40 having a surface 41 that reflects the exposure light. For example, table 40 may be a stainless steel sample table that is part of a conventional ultraviolet exposure apparatus. A photomask 42 having a mask pattern having opaque areas 441 and 442 is positioned over the photoresist layer 10 so as to cast a shadow over films 7 and 9. This mask blocks light from light source 15 that would otherwise directly expose the top surface of photoresist layer 10 in the region of films 7 and 9. The projection of the mask patterns 441 and 442 in the emission direction of the exposure light cover the thin films 7 and 9 as depicted by the broken lines in FIG. 4.

The photoresist layer 10 can be patterned in approximately the same shape as the base pattern defined by films 7 and 9 by using the mask patterns 441 and 442, which extend out from the edges of the thin films 7 and 9 about 10 $\mu$m. The exposure requires only a positioning precision of about 5 $\mu$m, since the exposure light will be reflected into the region under the mask patterns 441 and 442 except the region on thin film 7 and 9. An alignment precision of 5 $\mu$m can be easily attained merely by using a simple XY and rotary stage and a microscope. Hence, this embodiment of the invention can be practiced on a conventional UV exposure apparatus without requiring high precision alignment.

With this method, any portion of the photoresist 10 on the base pattern can be covered by using a suitable photomask pattern. Hence, areas that are not to include the developed photoresist pattern and are not over a corresponding thin film mask can also be protected.

Even if the table 40 has no reflective surface, this method can be implemented with ease if the rear surface of the sample is coated with a material that reflects light, such as nickel, tungsten, titanium, platinum, palladium, tantalum, chromium, silver, gold, or aluminum. In addition, the amount of exposure light that sneaks into the base pattern can be modified by adjusting the distance between the reflective surface 41 and the base pattern films. The exposure can be fine-tuned through by altering the distance between the light source and the device structure and by altering the direction, polarization, and focusing of the light.

The above-described embodiments of the invention have been discussed in reference to the construction of a laser diode. However, it will be appreciated from the preceding discussion that the invention can be used to generate a photoresist pattern over any opaque structure without requiring that a mask be positioned over that structure to a high precision.

Various modifications to the invention will become apparent to those skilled in the art from the foregoing description and accompanying drawings. Accordingly, the invention is to be limited solely by the scope of the following claims.

What is claimed is:

1. A method for generating a photoresist pattern on top of an object comprising a layer of material that is opaque to light of a predetermined wavelength, said method comprising:
    covering said object with a layer of photoresist material;
    irradiating said layer of photoresist material with light of said predetermined wavelength from a position under said object layer, including:
        providing a reflecting surface below said object,
        providing a light source above said object, and
        providing a mask between said object and said light source, said mask casting a shadow that completely covers said abject and a portion of the area surrounding said object; and
    developing said photoresist material to generate said photoresist pattern.

2. The method of claim 1, wherein:
    said object is located on a transparent substrate;
    providing said reflecting surface includes providing a table comprising said reflecting surface; and
    said method additionally comprises mounting said transparent substrate on said table.

3. A method for depositing a layer of dielectric material over a device, said dielectric layer having a via therethrough terminating on a metallic pad that is part of said device, said method comprising:
    covering said device with a layer of photoresist material;
    exposing said layer of photoresist material with light from a position below said metallic pad such that said metallic pad casts a shadow into said layer of photoresist material, including:
        providing a reflecting surface below said metallic pad,
        providing a light source above said metallic pad, and
        providing a mask between said metallic pad and said light source, said mask casting a shadow that completely covers said metallic pad and a portion of the area surrounding said metallic pad;
    removing those portions of said layer of photoresist material that were exposed to light, thereby leaving a patterned layer of photoresist over said metallic pad;
    depositing a layer of said dielectric material over said device, and
    removing said patterned layer of photoresist.

4. The method of claim 3, wherein said device comprises a plurality of layers of GaN deposited on a transparent substrate.

5. The method of claim 4, wherein said substrate is sapphire.

* * * * *